(12) United States Patent
Sorensen

(10) Patent No.: US 7,227,348 B2
(45) Date of Patent: Jun. 5, 2007

(54) APPARATUS FOR MEASURING AN A.C. CURRENT IN A CABLE

(76) Inventor: Thomas Sorensen, Darien, Annacotty, County Limerick (IE)

( * ) Notice: Subject to any disclaimer, the term of this patent is extended or adjusted under 35 U.S.C. 154(b) by 37 days.

(21) Appl. No.: 10/551,008

(22) PCT Filed: Mar. 29, 2004

(86) PCT No.: PCT/IE2004/000048

§ 371 (c)(1),
(2), (4) Date: Sep. 27, 2005

(87) PCT Pub. No.: WO2004/086063

PCT Pub. Date: Oct. 7, 2004

(65) Prior Publication Data

US 2006/0113987 A1    Jun. 1, 2006

(30) Foreign Application Priority Data

Mar. 27, 2003   (IE) ............................... S2003/0227

(51) Int. Cl.
*G01R 33/07* (2006.01)
(52) U.S. Cl. .................................. 324/126; 324/117 R
(58) Field of Classification Search .... 324/117 R–127, 324/158.1, 539; 336/175–176
See application file for complete search history.

(56) References Cited

U.S. PATENT DOCUMENTS

| | | | |
|---|---|---|---|
| 5,151,649 A | 9/1992 | Héroux | |
| 5,473,244 A | 12/1995 | Libove et al. | |
| 5,652,506 A | 7/1997 | Sorenson et al. | |
| 6,717,397 B2 | 4/2004 | Sorenson, Jr. | |
| 6,965,225 B2 * | 11/2005 | de Buda | 324/117 R |

* cited by examiner

*Primary Examiner*—Vinh P. Nguyen
(74) *Attorney, Agent, or Firm*—Whiteford, Taylor & Preston LLP; Jeffrey C. Maynard; Gregory M. Stone

(57) ABSTRACT

An apparatus for measuring alternating current in a conductor comprises first and second coils $a1_x$, $d1_x$ having substantially the same turns-area product and substantially parallel axes and located on the circumference of a circle with the first coil having its axis tangential to the circle and the second coil having its axis radially of the circle, and third and fourth coils $a1_y$, $d1_y$ also having substantially the same turns-area product and substantially parallel axes, the third and fourth coil means being located on the circumference of the same circle close to the first and second coil means respectively but having their axes orthogonal thereto. The coils are mounted on a support means configured to allow a conductor to be introduced into the centre of the said circle with the axis of the conductor normal to the plane containing the coils. The first and second coils are connected in series in anti-phase and the third and fourth coil means are connected in series in anti-phase, and the alternating current in the conductor is derived as a function of the voltages induced in the series-connected first and second coils and the series-connected third and fourth coils. Further coils are provided for interference suppression and signal enhancement.

16 Claims, 8 Drawing Sheets

APPARATUS FOR MEASURING AN A.C. CURRENT IN A CABLE

BACKGROUND OF THE INVENTION

This invention relates to an apparatus for measuring an alternating current flowing in an electric cable, for example an a.c. mains cable.

SUMMARY OF THE INVENTION

The present state of the art of measuring current in two or three core round cables is described in U.S. Pat. No. 5,652,506. Part of the coil arrangement used in this prior apparatus is shown in FIG. 1.

Eight identical wire-wound coils are used in total in the previous arrangement. For clarity sake, only four of these are shown in FIG. 1. The four coils shown pick up the x component Hx of magnetic field only from the cable 10. The other four identical coils, not shown in this diagram, are located at the same centres as the four shown; however they are wound in a plane which is normal to the plane of the four shown in order to pick up the y component Hy of magnetic field only.

Coil 1 and coil 2 are the main pickup coils for the Hx component of magnetic field and are connected in phase addition. Coil 3 and coil 4 are connected in phase opposition to coil 1 and coil 2. Coil 3 and coil 4 are used only to reduce the pickup of stray magnetic fields from other possible interfering current sources which are external to the coil arrangement.

The magnetic field pick-up of coil 1 and coil 2 from the current source to be measured is larger than the pickup by coil 3 and coil 4 since coils 3 and 4 are further away from the current source. Thus, when the output from coils 3 and 4 is subtracted from coils 1 and 2 the result is not zero. Therefore a voltage pickup proportional to the Hx component of magnetic field from the current source is present at the input to the amplifier AMP1.

For sources external and further away from the coil arrangement, however, the magnetic field created is much more uniform in magnitude and direction in the vicinity of the coils and the pickup from coils 3 and 4 almost completely cancels out the pickup from coils 1 and 2, significantly reducing any errors incurred due to other interfering current sources in the vicinity of the apparatus.

At the output of the amplifier AMP1 there is a voltage Vx which is proportional to the magnetic field component Hx created by the current flowing out in one conductor of the cable 10 and returning in the other.

The other four coils, picking up the Hy component, are connected identically to the four shown and are amplified separately by a similar amplifier AMP2, not shown. At the output of AMP2, therefore, a voltage Vy exists which is proportional to the Hy component of magnetic field.

It is useful at this stage to examine the Hx and Hy components of magnetic field created by a current I flowing out in one conductor of the cable 10 and returning in a second conductor of the cable, located a distance d away from the first conductor, as shown in FIG. 2. For the present it is assumed that the two conductors do not twist or rotate as they extend along the length of the cable.

Since the cable is round, no information is available as to the orientation angle θ of the coils to the conductors and θ is treated as a variable. Under these circumstances $$Hx = \frac{Id \cos\theta \sin\theta}{\pi r^2 \left[\left(1 + \frac{d^2}{4r^2}\right)^2 - \frac{d^2}{r^2}\sin^2\theta\right]} \qquad \text{Eq (1)}$$

$$Hy = \frac{Id\left(\sin^2\theta - \frac{1}{2} - \frac{d^2}{8r^2}\right)}{\pi r^2 \left[\left(1 + \frac{d^2}{4r^2}\right)^2 - \frac{d^2}{r^2}\sin^2\theta\right]} \qquad \text{Eq (2)}$$

Referring back to FIG. 1, if coil 1 is at an angle θ to the current-carrying conductors, then coil 2, which is located diametrically opposite to coil 1, has an angle θ+180° to the conductors and it is seen from equation (1) that Hx is identical for angles θ and θ+180°. When coils 1 and 2 are connected in phase addition, therefore, the pickup voltage is double the pickup voltage of one of these coils on its own.

A similar analysis applies to the other coils picking up the Hy component of magnetic field as given by equation (2).

If the magnitude of the magnetic field |H| is then computed from the Hx and Hy components given by equations (1) and (2) respectively, the following result is obtained:

$$|H| = \sqrt{Hx^2 + Hy^2} = \frac{Id}{2\pi r^2} \frac{1}{\sqrt{\left(1 + \frac{d^2}{4r^2}\right)^2 - \frac{d^2}{r^2}\sin^2\theta}} \qquad \text{Eq. (3)}$$

Now Vx, the output voltage of AMP1, is proportional to Hx, and Vy, the output voltage of AMP2, is proportional to Hy.

V is evaluated from Vx and Vy, as follows:

$$V = \sqrt{Vx^2 + Vy^2} = K|H| = \frac{KId}{2\pi r^2} \frac{1}{\sqrt{\left(1 + \frac{d^2}{4r}\right)^2 - \frac{d^2}{r^2}\sin^2\theta}} \qquad \text{Eq. (4)}$$

Where K is a constant that depends on the area and number of the coil turns and the amplifier gain.

The computed voltage V is a maximum at θ=90° and is given by $$V\max = \frac{KId}{2\pi r^2 \left(1 - \frac{d^2}{4r^2}\right)} \qquad \text{Eq (5)}$$

and V is a minimum when θ=0°

$$V\min = \frac{KId}{2\pi r^2 \left(1 + \frac{d^2}{4r^2}\right)} \qquad \text{Eq (6)}$$

The average value of V is approximately $$V = \frac{KId}{2\pi r^2} \qquad \text{Eq (7)}$$

Equation (7) is the equation used to evaluate the current I, since K and r are known, and d can be estimated fairly accurately in the previously patented technique.

For I fixed, however, there is an inherent variation in the measured voltage V as the coil positions around the cable vary as indicated by equations (5) and (6). The maximum variation from equation (7) depends on the value of $d^2/4r^2$. For $d/r=\frac{1}{2}$ there is a maximum variation (error) of ±6.3%. For $d/r<\frac{1}{2}$ the variation (error) is smaller in theory. In practice, however, the best accuracy that can be achieved with this previous apparatus, in round cables, is of the order of ±11%.

The reason the performance is worse than indicated by equation (4) is primarily due to the fact that in round cables the conductors twist as they extend along the length of the cable. It was assumed in deriving equation (4) that the conductors stay parallel and straight along the cable.

Equation (4) indicates that the maximum pickup occurs when the angle $\theta=90°$ and the minimum pickup occurs when $\theta=0°$. It is found that this effect reverses itself when the conductors are twisted beyond a certain limit, causing the maximum pickup to occur at $\theta=0°$ and the minimum to occur at $\theta=90°$. The variation in pickup of this previous apparatus as the coils move round the twisted conductors depends on the rate of twist, the spacing d, and the distance to the coils r.

If V is computed from $V=\sqrt{V_x^2+V_y^2}$ for the coil arrangement shown in FIG. 1, then variations in readings as the coils rotate round the cable vary from cable to cable but can exceed ±15%.

The coil arrangement shown in FIG. 1 is therefore limited in its accuracy, and it is an object of the invention to provide a new apparatus which is capable of giving greater accuracy.

This object is met by the invention claimed in claim 1. Preferred embodiments of the invention are claimed in the dependent claims.

In this specification the axis of a coil means that direction relative to the coil which, when orientated parallel to the direction of a fluctuating magnetic field passing through the coil, would provide the maximum induced voltage in the coil for that magnetic field.

BRIEF DESCRIPTION OF THE DRAWINGS

An embodiment of the invention will now be described, by way of example, with reference to the accompanying drawings, in which.

DETAILED DESCRIPTION OF THE PREFERRED EMBODIMENTS

Figure 1:
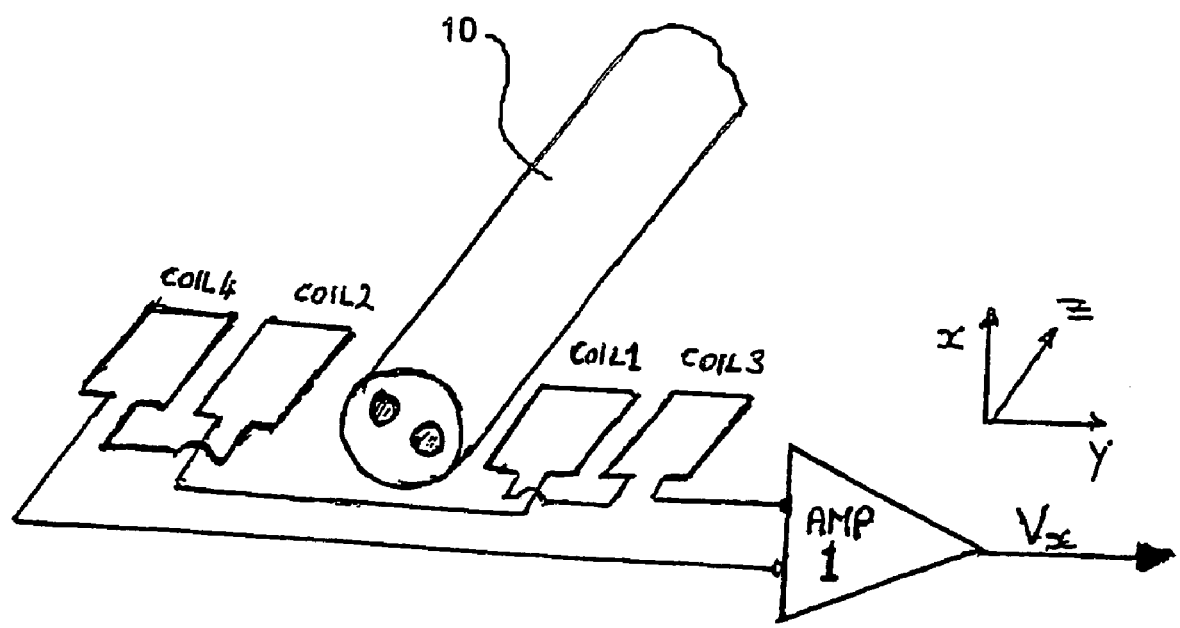
FIG. 1, previously described, shows part of a prior art apparatus.

As described, coils 1 and 2 of the apparatus shown in FIG. 1 pick up the Hx component of magnetic field. These coils are also present in the apparatus shown in FIG. 3, which is a circuit diagram of the coil arrangement of a basic embodiment of the present invention, but they are referred to there as coils $a_x$ and $b_x$. The apparatus of FIG. 3 also includes two further coils $c_x$ and $d_x$ which also pick up the Hx component of magnetic field. These two further coils $c_x$ and $d_x$ are located at the same distance as coils $a_x$ and $b_x$ from the centre of the cable 10 but are located above and below the cable so that a line joining coil $c_x$ to coil $d_x$ is at an angle of 90° to a line joining coil $a_x$ and coil $b_x$. Thus all four coils $a_x$ to $d_x$ lie in a plane which is perpendicular to the axis of the cable 10 on the circumference of a notional circle of radius r whose centre is coaxial with the cable 10. All four coils $a_x$ to $d_x$ have substantially parallel axes; thus the axes of coils $a_x$ and $b_x$ are tangential to the notional circle while the axes of coils $c_x$ and $d_x$ extend radially of the notional circle. All four coils $a_x$ to $d_x$ have substantially the same turns-area product.

Figure 2:
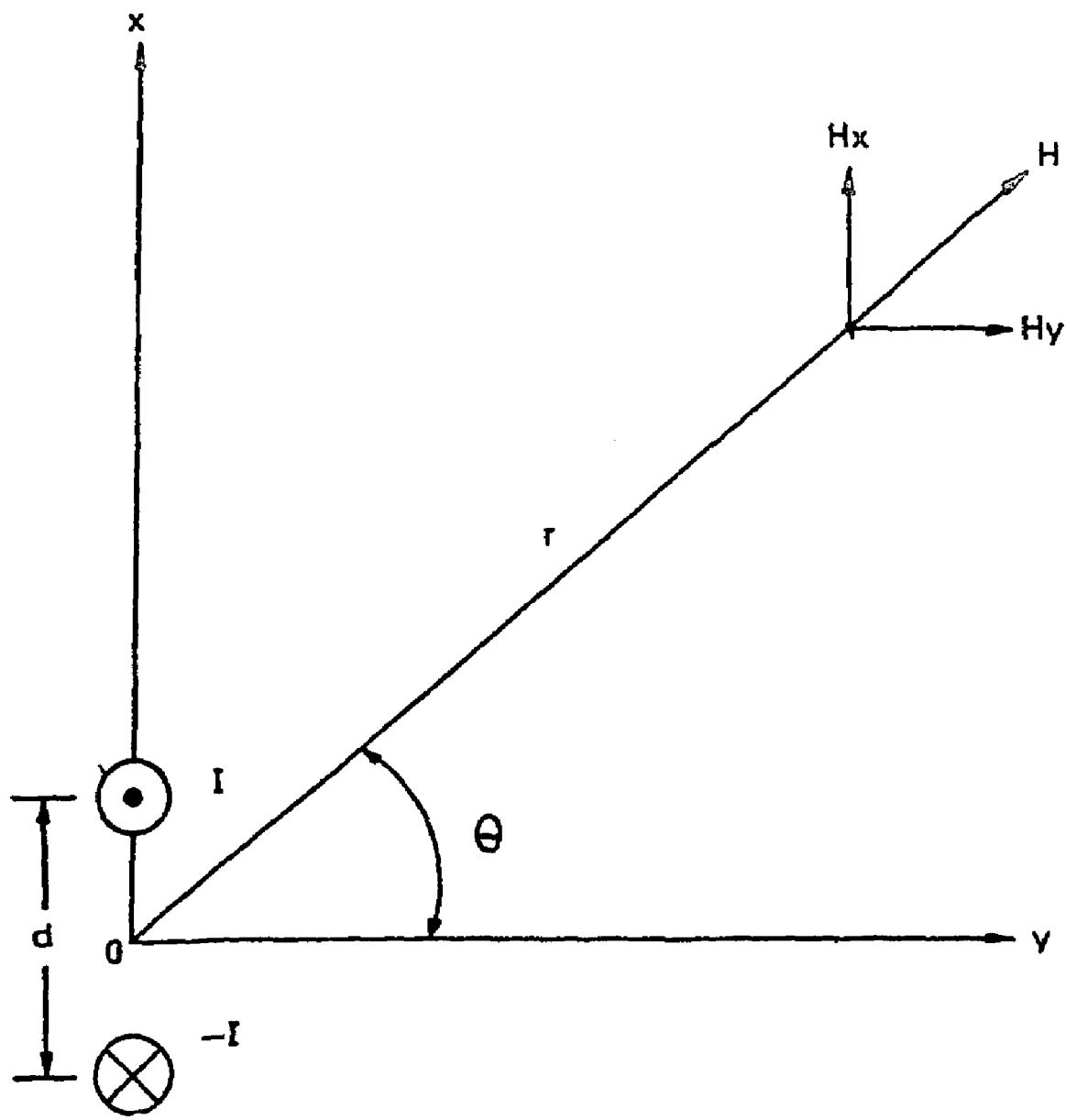
FIG. 2 is a diagram to assist in understanding the operation and limitations of the prior art.

Thus, with reference to FIG. 2, if coil $a_x$ is at an angle $\theta$ to the two conductors of the cable 10, then coil $d_x$ is at $90°+\theta$, coil $b_x$ is at $180°+\theta$ and coil $c_x$ is at $270'+\theta$. The advantage of this apparatus over the previous one, if the coils are connected in series in the correct polarity in the manner to be described, is that the pickup repeats itself every 90° of rotation and so the pickup at $\theta=0°$ and $\theta=90°$ are identical. In the previous apparatus maximum variation between reading occurred at $\theta=0°$ and 90°.

Figure 3:
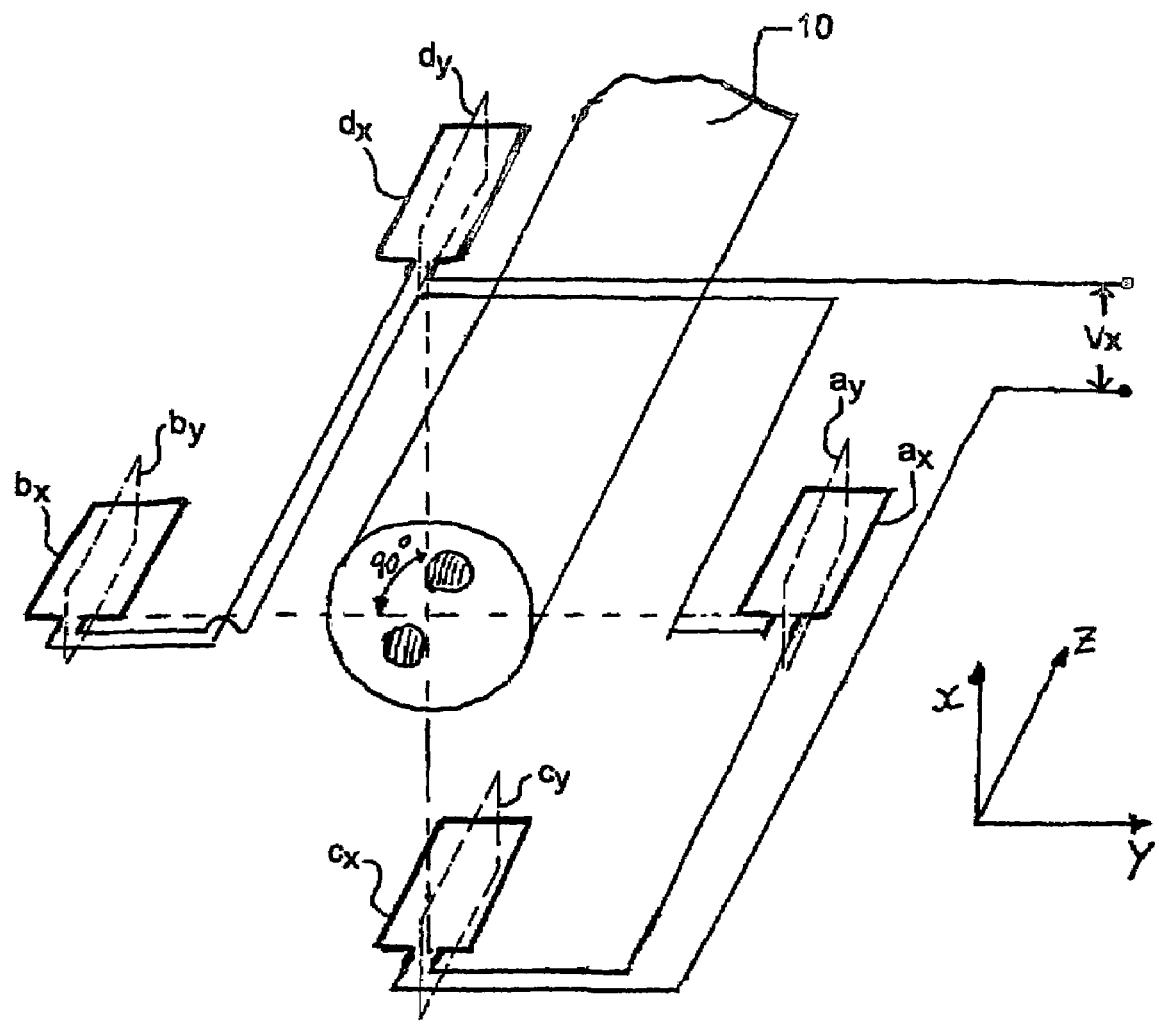
FIG. 3 is a schematic diagram of the coil arrangement of a basic embodiment of the present invention.

The variation in pickup of the Hx component of magnetic field that occurs at each of the four coils $a_x$ to $d_x$ located round a parallel pair of conductors, as shown in FIG. 3, is now examined with the use of equation (1).

If coil $a_x$ is at an angle $\theta$ to the conductor pair then Hx at coil $a_x$ is given by equation (1) as:

$$Hx(a_x) = \frac{Id\cos\theta\sin\theta}{\pi r^2\left[\left(1+\frac{d^2}{4r^2}\right)^2 - \frac{d^2}{r^2}\sin^2\theta\right]} \qquad \text{Eq (8)}$$

For coil $d_x$ its angle is $90+\theta$ to the conductors and the Hx component there, again from equation (1), is $$Hx(d_x) = -\frac{Id\cos\theta\sin\theta}{\pi r^2\left[\left(1+\frac{d^2}{4r^2}\right)^2 - \frac{d^2}{r^2}\sin^2\theta\right]} \qquad \text{Eq (9)}$$

For coil $b_x$ its angle is $180°+\theta$ to the conductors and therefore $$Hx(b_x) = \frac{Id\cos\theta\sin\theta}{\pi r^2 \left[\left(1 + \frac{d^2}{4r}\right)^2 - \frac{d^2}{r^2}\sin^2\theta\right]} \quad \text{Eq (10)}$$

For coil ($c_x$) its angle is 270°+θ to the conductors giving $$Hx(c_x) = -\frac{Id\cos\theta\sin\theta}{\pi r^2 \left[\left(1 + \frac{d^2}{4r^2}\right)^2 - \frac{d^2}{r^2}\cos^2\theta\right]} \quad \text{Eq (11)}$$

Coils $a_x$ to $d_x$ are all connected in series, as shown in FIG. 3, in the following polarities. Coils $a_x$ and $b_x$ have an in-phase connection and coils $c_x$ and $d_x$ are connected in anti-phase to coils $a_x$ and $b_x$ so that the voltage V(x) induced in the series connection of coils $a_x$ to $d_x$ is proportional to:

Hx($a_x$)+Hx($b_x$)−Hx($c_x$)−Hx($d_x$).

Substituting for the values of these magnetic fields from equations (8), (9), (10), and (11) and simplifying gives $$Hx(a_x) + Hx(b_x) - Hx(c_x) - Hx(d_x) = \quad \text{Eq (12)}$$

$$\frac{4Id}{\pi r^2} \frac{\cos\theta\sin\theta\left(1 + \frac{d^4}{16r^4}\right)}{\left[\left(1 + \frac{d^2}{4r^2}\right)^2 - \frac{d^2}{r^2}\cos^2\theta\right]\left[\left(1 + \frac{d^2}{4r^2}\right)^2 - \frac{d^2}{r^2}\sin^2\theta\right]}$$

The arrangement of FIG. 3 also includes four further coils $a_y$, $b_y$, $c_y$ and $d_y$ each having substantially the same turns-area product as each of the coils $a_x$ to $d_x$. Each coil $a_y$ to $d_y$ is placed, as far as is physically practical, at the same location as a corresponding one of the coils $a_x$ to $d_x$, but its axis is rotated through 90° so that the axes of the coils $a_y$ and $b_y$ are tangential to the notional circle and the axes of the coils $c_y$ and $d_y$ extend radially of the notional circle. Thus four pairs $a_x/a_y$, $b_x/b_y$, $c_x/c_y$ and $d_x/d_y$ of closely positioned coils are present with the coils in each pair having substantially orthogonal axes. This close positioning of the pairs of coils $a_x/a_y$, etc. at the same location can be achieved, for example, using orthogonal pairs of coils as shown in FIG. 9 of U.S. Pat. No. 5,652,506 but an alternative construction using PCB technology will be described later. As will be evident to the reader, each of the coils $a_y$ to $d_y$ is orientated to pick up the y component Hy of the magnetic field generated by the cable 10 at the respective location.

Let Hy($a_y$) be the y component of magnetic field picked up by the coil $a_y$.

Let Hy($b_y$) be the y component of magnetic field picked up by the coil $b_y$.

Let Hy($c_y$) be the y component of magnetic field picked up by the coil $c_y$.

Let Hy($d_y$) be the y component of magnetic field picked up by the coil $d_y$.

From equation (2)

$$Hy(a_y) = \frac{Id}{\pi r^2} \frac{\left[\sin^2\theta - \frac{1}{2} - \frac{d^2}{8r^2}\right]}{\left[\left(1 + \frac{d^2}{4r^2}\right)^2 - \frac{d^2}{r^2}\sin^2\theta\right]} \quad \text{Eq (13)}$$

$$Hy(d_y) = \frac{Id}{\pi r^2} \frac{\left[\cos^2\theta - \frac{1}{2} - \frac{d^2}{8r^2}\right]}{\left[\left(1 + \frac{d^2}{4r^2}\right)^2 - \frac{d^2}{r^2}\cos^2\theta\right]} \quad \text{Eq (14)}$$

$$Hy(b_y) = \frac{Id}{\pi r^2} \frac{\left[\sin^2\theta - \frac{1}{2} - \frac{d^2}{8r^2}\right]}{\left[\left(1 + \frac{d^2}{4r^2}\right)^2 - \frac{d^2}{r^2}\sin^2\theta\right]} \quad \text{Eq (15)}$$

$$Hy(c_y) = \frac{Id}{\pi r^2} \frac{\left[\cos^2\theta - \frac{1}{2} - \frac{d^2}{8r^2}\right]}{\left[\left(1 + \frac{d^2}{4r^2}\right)^2 - \frac{d^2}{r^2}\cos^2\theta\right]}. \quad \text{Eq (16)}$$

These four coils $a_y$ to $d_y$ picking up the Hy component of magnetic field are connected in series with the same polarities as the four coils $a_x$ to $d_y$ picking up the Hx component; i.e. coils $a_y$ and $b_y$ are connected in phase and coils $c_y$ and $d_y$ are connected in antiphase to coils $a_y$ and $b_y$. To avoid over-complicating FIG. 3 the connections between the coils $a_y$ to $d_y$ are not shown in that figure.

A voltage V(y) is therefore induced in the series connection proportional to

Hy($a_y$)+Hy($b_y$)−Hy($c_y$)−Hy($d_y$).

Substituting for the values of these magnetic fields from equation (13) to (16) and simplifying gives $$Hy(a_y) + Hy(b_y) - Hy(c_y) - Hy(d_y) = \quad \text{Eq (17)}$$

$$\frac{2Id}{\pi r^2} \frac{(\sin^2\theta - \cos^2\theta)\left(1 - \frac{d^4}{16r^4}\right)}{\left[\left(1 + \frac{d^2}{4r^2}\right)^2 - \frac{d^2}{r^2}\sin^2\theta\right]\left[\left(1 + \frac{d^2}{4r}\right)^2 - \frac{d^2}{r^2}\cos^2\theta\right]}.$$

V is now evaluated as:

$$V = \sqrt{V(x)^2 + V(y)^2} \quad \text{Eq (18)}$$

$$= K\sqrt{[Hx(a_x) + Hx(b_x) - Hx(c_x) - Hx(d_x)]^2 + [Hy(a_y) + Hy(b_y) - Hy(c_y) - Hy(d_y)]^2}$$

where K is a constant, as before.

Substituting in equation (18) from equations (12) and (17), and simplifying, gives $$V = \frac{2KdI}{\pi r^2} \frac{1}{\sqrt{\left(1 - \frac{d^4}{16r^4}\right)^2 + \frac{d^4}{r^4}\sin^2\theta\cos^2\theta}} \quad \text{Eq (19)}$$

The minimum value of V occurs when θ=45° and this value is given by $$V_{MIN} = \frac{2KdI}{\pi r^2 \left(1 + \frac{d^4}{16r^4}\right)} \quad \text{Eq (20)}$$

The maximum value of V occurs when θ=0° or θ=90° and this maximum value is given by $$V_{MAX} = \frac{2KdI}{\pi r^2 \left(1 - \frac{d^4}{16r^4}\right)} \quad \text{Eq (21)}$$

The mean value is approximately $$V_{AV} = \frac{2KdI}{\pi r^2} \quad \text{Eq (22)}$$

Except for a factor of four, equation (22) of the new apparatus is exactly the same as equation (7) of the previous apparatus. However, the variation from maximum to minimum of the previous apparatus as the sensor is rotated depends on the magnitude of $d^2/4r^2$, whereas for the new coil arrangement it depends on the magnitude of $d^4/16r^4$. Thus, for d/r=½ the reading varies by ±6.3% for the previous apparatus whereas the new apparatus, with d/r=½, varies by only ±0.4%.

The improvement using the new coil arrangement as given by equation (19) compared to the previous apparatus as given by equation (4) is strictly true only for conductors which do not twist as they extend along the length of the cable. However, the new apparatus is far less prone to errors caused by cable rotation or conductor twisting with variations of <2% recorded in V as the cable is rotated by 360° for this new coil arrangement. The previous apparatus records variations of 15% or larger where the same cable is rotated in the jaws of the instrument.

In the previous coil arrangement, as shown in FIG. 1, coil 3 and coil 4 are connected in anti-phase with coil 1 and coil 2, and their purpose is to reduce the pickup of interference from the other current sources in the vicinity of the meter. The interference pickup of the coil arrangement shown in FIG. 3 is now examined with reference to FIG. 4.

Figure 4:
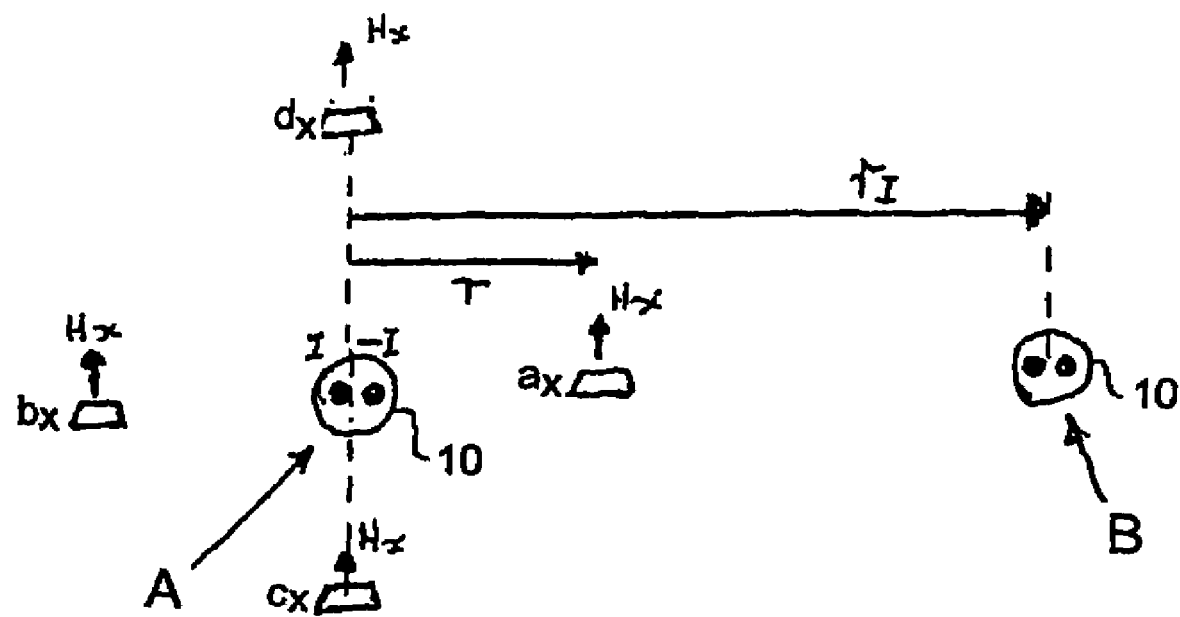
FIG. 4 is a diagram of the embodiment of FIG. 3 illustrating the effect of an interfering source.

FIG. 4 shows the coils $a_x$ to $d_x$ located on the circle of radius r. Also shown is a cable 10 carrying a current I located at two possible positions, position A or position B. Position A is the location of the cable when a measurement of its current I is made. Position B shows the same cable, located a distance $r_I$ from the centre of the circle, carrying the same current I but exterior to the coil arrangement, where it is acting as an interfering source. The interference suppression S of the coil arrangement is defined as:

$$S = \frac{\text{Pickup in position } B}{\text{Pickup in position } A} \quad \text{Eq. (23)}$$

The smaller the value of S the better the suppression. The pickup in position A is given by equation (22)

$$\text{Pickup in position } A = \frac{2KdI}{\pi r^2}$$

It may be shown that the pickup in position B is given by $$\text{Pickup in position } B = \frac{6r^2 KdI}{\pi(r_I^4 - r^4)} \quad \text{Eq. (24)}$$

$$\text{Therefore } S = \frac{3r^4}{r_I^4\left(1 - \frac{r^4}{r_I^4}\right)} \quad \text{Eq. (25)}$$

It is seen from equation (25) that the smaller the value of $$\frac{r}{r_I}$$

the better the suppression.

If it is assumed, due to coil and apparatus housings, that the closest an interference source can get to the coil arrangement is $r_I=2r$, then the maximum value of S from equation (25) is S=0.2 or 20%. As the interfering source moves further away S decreases fairly rapidly, with S=4% for $r_I=3r$ and S=1% for $r_I=4r$. This maximum interference value of 20% is in general unacceptable and is reduced significantly by employing the following technique.

Figure 5:
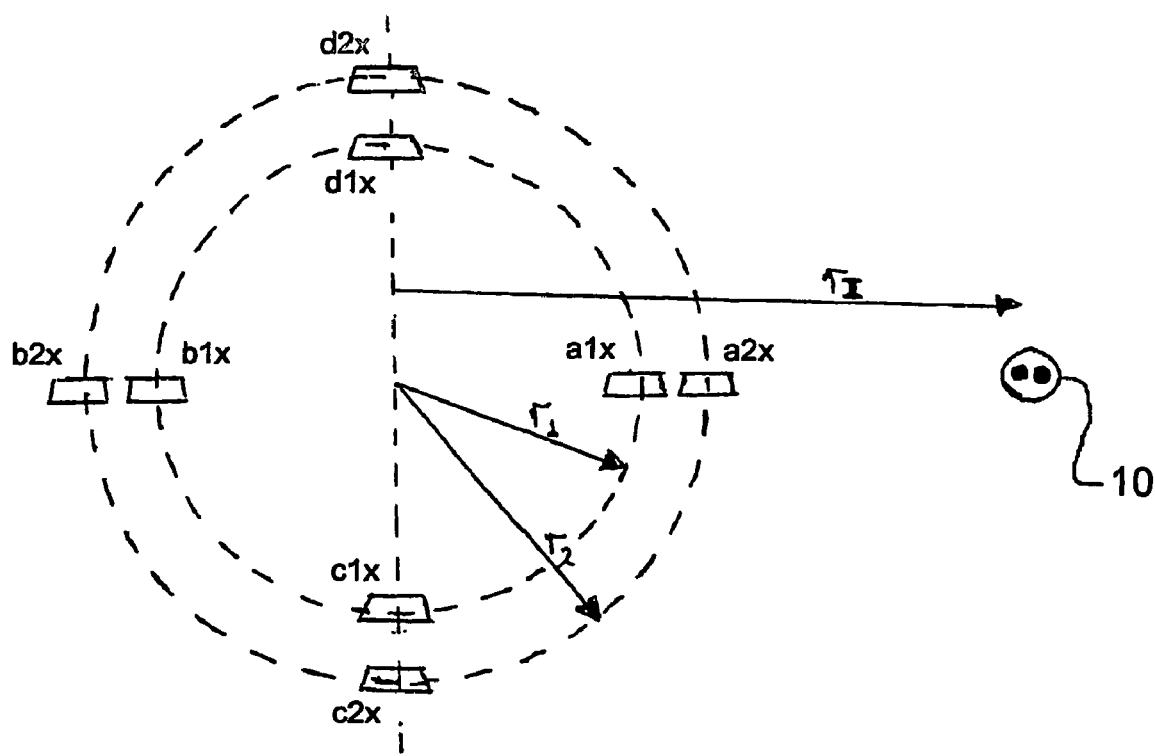
FIG. 5 is a further development of the embodiment of FIG. 3.

It is noted from equation (24) that the interference pickup is primarily proportional to $r^2$ where r is the distance of the coils from the centre. Consider therefore the situation as shown in FIG. 5. In this arrangement, two sets of coils are used to pickup the Hx component of magnetic field, an inner set $a1_x$ to $d1_x$ located at 90° intervals around the circumference of a circle of radius r, and an outer set $a2_x$ to $d2_x$ located at 90° intervals around the circumference of a circle of radius $r_2$ coaxial with the first circle. The four inner coils $a1_x$ to $d1_x$ correspond to the coils $a_x$ to $d_x$ shown in FIG. 3, and are connected in series in the same way, and the four outer coils $a2_x$ to $d2_x$ are also connected in series in the manner shown in FIG. 3. Each outer coil $a2_x$ to $d2_x$ is located on the same radial line as a corresponding one of the inner coils $a1_x$ to $d1_x$ and all eight coils have substantially parallel axes and substantially the same area-turns product.

Let $V_{1x}$ be the pickup by the inner set of coils from the interfering source at distance $r_I$ which is given by equation (24) with $r=r_1$.

$$V_{1x} = \frac{6r_1^2 KdI}{\pi(r_I^4 - r_1^4)} \quad \text{Eq. (26)}$$

Let $V_{2x}$ be the pickup by the outer set of coils from the same interfering source.

$$V_{2x} = \frac{6r_2^2 K dl}{\pi(r_I^4 - r_2^4)} \quad \text{Eq. (27)}$$

In order to reduce the pickup from this interfering source a fraction, $r1^2/r2^2$, of the outer voltage is subtracted from the inner voltage to give Vx, where $$V_x = V_{1x} - \frac{r_1^2}{r_2^2} V_{2x} \quad \text{Eq. (28)}$$

Substituting for $V_{1x}$ and $V_{2x}$ from equations (26) and (27) gives $$V_x = \frac{6r_1^2 K dl}{\pi(r_I^4 - r_1^4)} - \frac{r_1^2}{r_2^2}\left[\frac{6r_2^2 K dl}{\pi(r_I^4 - r_2^4)}\right]$$

Simplifying gives $$V_x = \frac{6 K dl}{\pi} \frac{r_1^2}{r_I^8} \frac{(r_1^4 - r_2^4)}{\left(1 - \frac{r_1^4}{r_I^4}\right)\left(1 - \frac{r_2^4}{r_I^4}\right)} \quad \text{Eq. (29)}$$

Since this is the pickup from the interfering source at distance $r_I$, call this voltage $V_{xB}$.

i.e. $$V_{xB} = \frac{6 K dl}{\pi} \frac{r_1^2}{r_I^8} \frac{(r_1^4 - r_2^4)}{\left(1 - \frac{r_1^4}{r_I^4}\right)\left(1 - \frac{r_2^4}{r_I^4}\right)} \quad \text{Eq. (30)}$$

Consider now the pickup from the same current source when it is located in the measurement position (in the centre of the coil system) when the total voltage pickup is again computed from equation (28).

The pickup voltage $V_{1x}$ of the inner coil set is given by equation (22) with $r=r_1$.

$$V_{1x} = \frac{2 K dl}{\pi r_1^2}$$

Similarly, the pickup voltage $V_{2x}$ of the outer set is given by equation (22) with $r=r2$.

$$V_{2x} = \frac{2 K dl}{\pi r_2^2}$$

The total pickup voltage $V_{xa}$ with the cable in the measurement position is obtained by substituting these values of $V_{1x}$ into equation (28)

$$V_{xA} = \frac{2 K dl}{\pi r_1^2} - \frac{r_1^2}{r_2^2} \frac{2 K dl}{\pi r_2^2} \quad \text{Eq. (31)}$$

-continued $$V_{xA} = \frac{2 K dl}{\pi} \frac{(r_2^4 - r_1^4)}{r_1^2 r_2^4}$$

The interference ratio S, given by equation (23) for this new apparatus with inner and outer sets of coils, is $$S = \frac{VxB}{VxA} = \frac{6 K dl r_1^2 (r_1^4 - r_2^4)}{\pi r_I^8\left(1 - \frac{r_1^4}{r_I^4}\right)\left(1 - \frac{r_2^4}{r_I^4}\right)} \times \frac{r_1^2 r_2^4 \pi}{(r_2^4 - r_1^4) 2 K dl}$$

Simplifying gives $$S = \frac{3 r_1^4 r_2^4}{r_I^8\left(1 - \frac{r_1^4}{r_I^4}\right)\left(1 - \frac{r_2^4}{r_I^4}\right)} \quad \text{Eq. (32)}$$

If the inner set on its own had only been used, the interference ratio for that arrangement was given previously by equation (25) with $r=r_1$ giving $$S(r_1 \text{only}) = \frac{3 r_1^4}{r_I^4\left(1 - \frac{r_1^4}{r_I^4}\right)} \quad \text{Eq. (33)}$$

The interference ratio S of the new apparatus as given by equation (32) is smaller than that for the inner set on its own, as given by equation (33), by the factor $$\frac{r_2^4}{r_I^4} \frac{1}{\left(1 - \frac{r_2^4}{r_I^4}\right)}$$

For example when $r=2r_2$ this factor is 0.067, causing a reduction in interference pickup by a factor of 16 approximately. Thus, the worst interference drops from 20% for the inner set on its own to 1.25% when the inner and outer voltages are subtracted in the ratio given by equation (28) i.e. $r_1^2/r_2^2$. When the interfering sources are further, away the reduction factor is even larger. The subtraction of the factor $r_1^2/r_2^2$ of the outer voltage from the inner voltage may be implemented with a resistor divider network or as part of an amplifier input stage as will be described with reference to FIG. 7.

The same considerations apply to the coils detecting the Hy component of the magnetic field.

Figure 6:
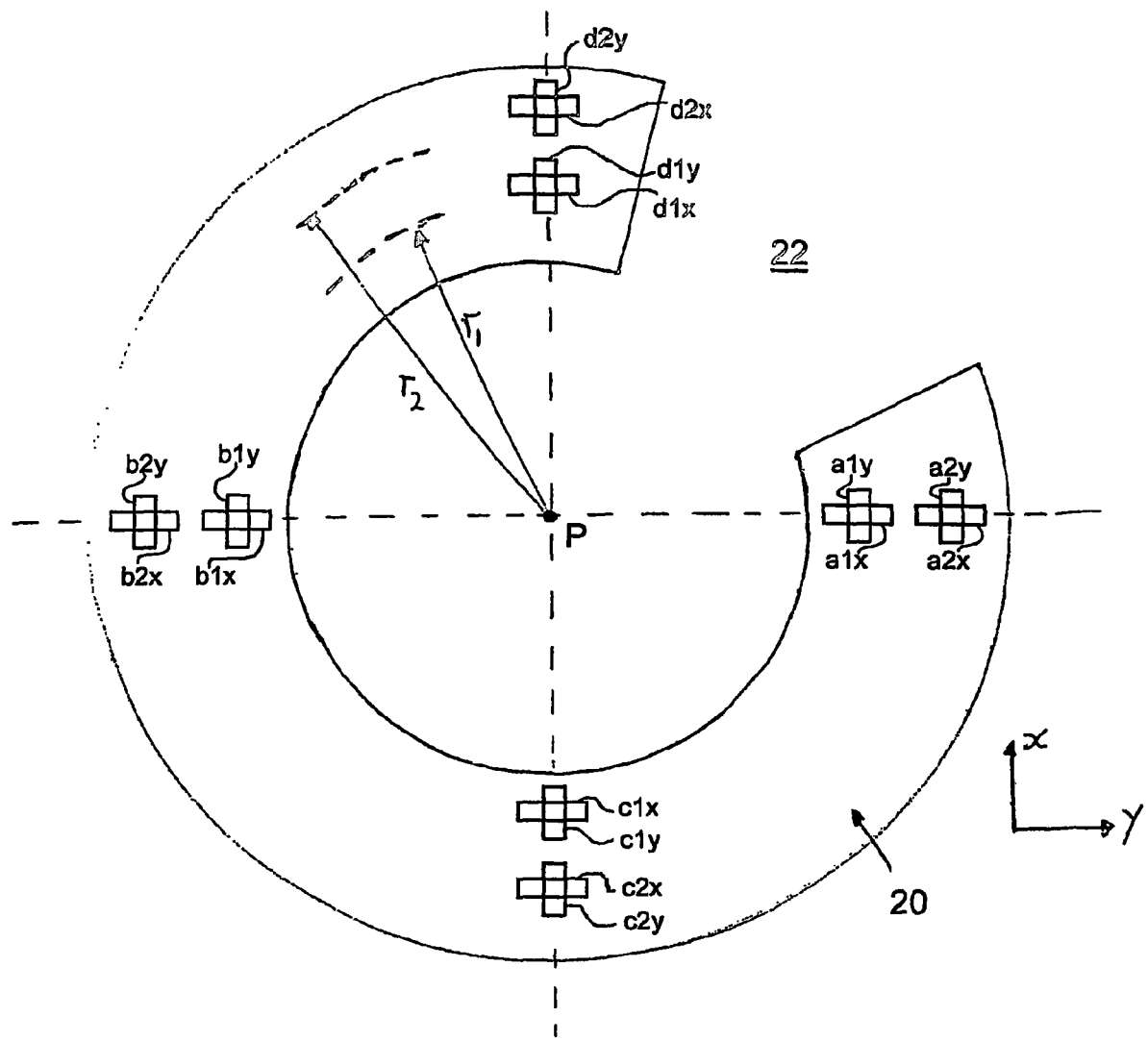
FIG. 6 shows an embodiment of the invention with interference suppression.

FIG. 6 is a plan view of an embodiment of the invention incorporating interference suppression as described above, and FIG. 7 is its circuit diagram.

In FIG. 6, the four inner coils $a1_x$ to $d1_x$ are mounted on a "C-shaped" insulating motherboard 20 at 90° intervals around the circumference of a notional circle of radius $r_1$, and the four outer coils $a2_x$ to $d2_x$ are mounted on the motherboard 20 at 90° intervals around the circumference of a notional circle of radius $r_2$, the two circles being concentric. All eight coils $a1_x$ to $d1_x$ and $a2_x$ to $d2_x$ have substantially the same area-turns product and substantially parallel axes and are located substantially in a common plane.

Also mounted on the motherboard 20 are eight further coils, an inner set of coils $a1_y$ to $d1_y$ and an outer set of coils $a2_y$ to $d2_y$. The coils $a1_y$ to $d1_y$ and $a2_y$ to $d2_y$ have substantially parallel axes and substantially the same turns-area product as the coils $a1_x$ to $d1_x$ and $a2_x$ to $d2_x$. However, their axes are normal to the axes of the coils $a1_x$ to $d1_x$ and $a2_x$ to $d2_x$. Thus each coil $a1_x$ to $d1_x$ and $a2_x$ to $d2_x$ forms an orthogonal pair of coils with a corresponding one of the coils $a1_y$ to $d1_y$ and $a2_y$ to $d2_y$, wherein in each orthogonal pair the two coils, e.g. the pair of coils $a1_x$ and $a1_y$, are at substantially the same location on the motherboard 20, insofar as that is physically practical using the chosen technology, but the axis of one of the coils is rotated through 90° relative to the other coil so that the axis of one coil is tangential to the notional circle on which it lies while the axis of the other coil extends radially of the same circle. Thus the motherboard 20 bears eight orthogonal pairs of coils, four inner pairs $a1_x/a1_y$, $b1_x/b1_y$, $c1_x/c1_y$ and $d1_x/d1_y$ and four outer pairs $a2_x/a2_y$, $b2_x/b2_y$, $2_x/c2_y$ and $d2_x/d2_y$. As mentioned above, this close positioning of the pairs of coils $a1_x/a1_y$, $b1_x/b1_y$, . . . etc. at the substantially same physical location can be achieved using orthogonal pairs of coils as shown in FIG. 9 of U.S. Pat. No. 5,652,506.

The gap 22 in the C-shaped motherboard 20 allows a cable 10, not shown in FIG. 6, to be introduced into the support so as to be positioned at the point P at the centre of the circles of radius $r_1$ and $r_2$, the cable extending normal to the plane containing the coils (i.e. normal to the plane of FIG. 6). In practice the motherboard 20 and coils mounted thereon will be accommodated in a housing (not shown) which could incorporate a clamp or other mechanical device to locate the cable at the point P. Clearly, each of the coils $a1_x$ to $d1_x$ and $a2_x$ to $d2_x$ is orientated to pick up the x component Hx of the magnetic field generated by the cable 10, while each of the coils $a1_y$ to $d1_y$ and $a2_y$ to $d2_y$ is orientated to pick up the y component Hy of the magnetic field generated by the cable 10.

Figure 7:
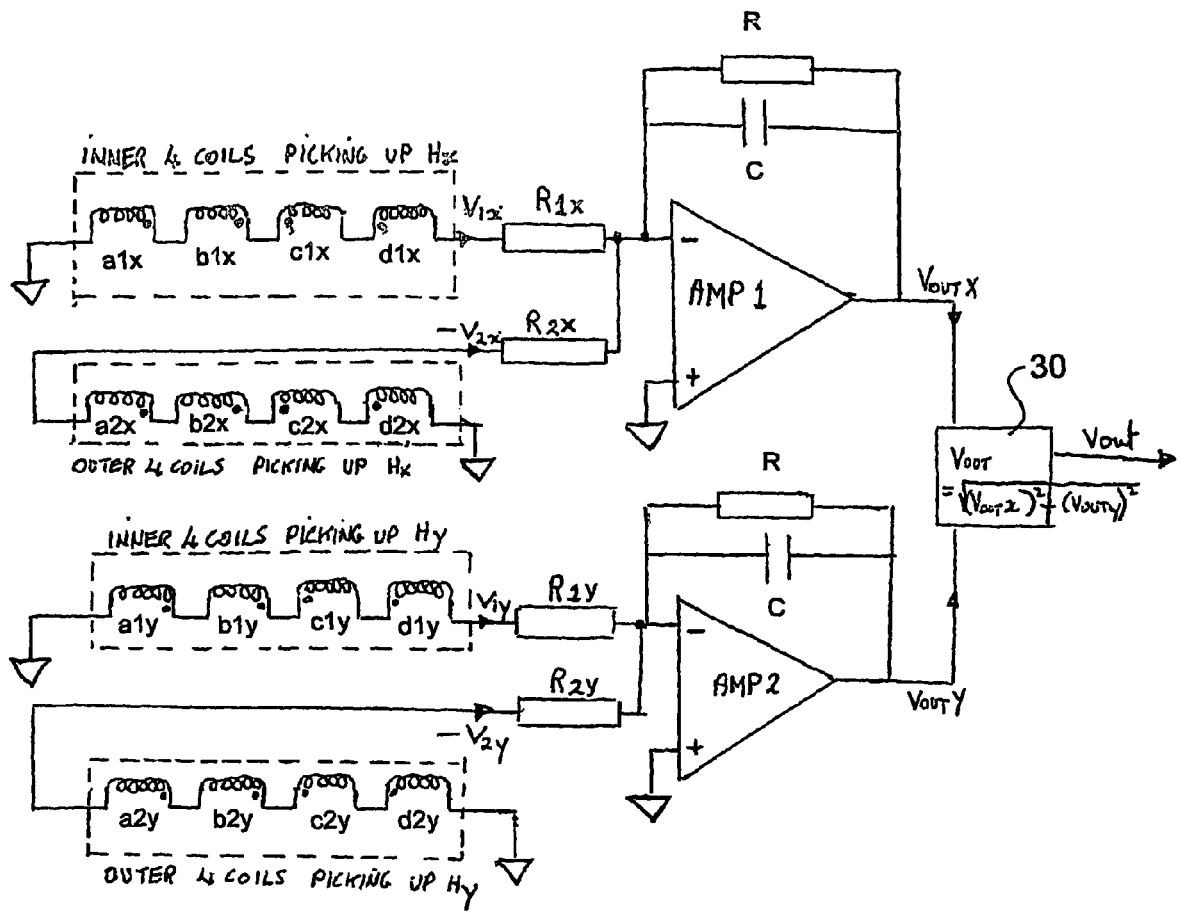
FIG. 7 is a circuit diagram of the embodiment of FIG. 6.

The coils are connected as shown in FIG. 7:
- Coils $a1_x$ and $b1_x$ are connected in phase with one another and coils $c1_x$ and $d1_x$, although connected in phase with one another, are connected in anti-phase to coils $a1_x$ and $b1_x$ to give an overall output voltage $V_{1x}$ at the input to a resistor $R_{1x}$.
- Coils $a2_x$ and $b2_x$ are connected in phase with one another and coils $c2_x$ and $d2_x$, although connected in phase with one another, are connected in anti-phase to coils $a2_x$ and $b2_x$ to give an overall output voltage $V_{2x}$ at the input to a resistor $R_{2x}$ (the voltage $V_{2x}$ is shown minus because the entire series connection of coils $a2_x$ to $d2_x$ is connected in reverse polarity to coils $a1_x$ to $d1_x$).
- Coils $a1_y$ and $b1_y$ are connected in phase with one another and coils $c1_y$ and $d1_y$, although connected in phase with one another, are connected in anti-phase to coils $a1_y$ and $b1_y$ to give an overall output voltage $V_{1y}$ at the input to a resistor $R_{1y}$.
- Coils $a2_y$ and $b2_y$ are connected in phase with one another and coils $c2_y$ and $d2_y$, although connected in phase with one another, are connected in anti-phase to coils $a2_y$ and $b2_y$ to give an overall output voltage $V_{2y}$ at the input to a resistor $R_{2y}$ (again, the voltage $V_{2y}$ is shown minus because the entire series connection of coils $a2_y$ to $d2_y$ is connected in reverse polarity to coils $a1_y$ to $d1_y$).

The resistors $R_{1x}$ and $R_{2x}$ are connected in common to the negative input to an amplifier AMP1 and are chosen such that:

$$\frac{R_{1x}}{R_{2x}} = \left(\frac{r_1^2}{r_2^2}\right)$$

$V_{out}x$ is therefore given as $$V_{out}x = \frac{-R}{1 + j\omega cR}\left(\frac{V_{1x}}{R_{1x}} - \frac{V_{2x}}{R_{2x}}\right)$$

For the frequency range of interest, $j\omega Rc$ is much greater than 1, therefore $$V_{out}x = \frac{-1}{j\omega c}\left(\frac{V_{1x}}{R_{1x}} - \frac{V_{2x}}{R_{2x}}\right)$$
$$= \frac{j}{\omega c R_{1x}}\left(V_{1x} - \frac{R_{1x}V_{2x}}{R_{2x}}\right)$$

Similarly, the resistors $R_{1y}$ and $R_{2y}$ are connected in common to the negative input to an amplifier AMP2 and are chosen such that:

$$\frac{R_{1y}}{R_{2y}} = \left(\frac{r_1^2}{r_2^2}\right)$$

$V_{out}y$ is therefore given as $$V_{out}y = \frac{-R}{1 + j\omega cR}\left(\frac{V_{1y}}{R_{1y}} - \frac{V_{2y}}{R_{2y}}\right)$$

For the frequency range of interest, $j\omega Rc$ is much greater than 1, therefore $$V_{out}y = \frac{-1}{j\omega c}\left(\frac{V_{1y}}{R_{1y}} - \frac{V_{2y}}{R_{2y}}\right)$$
$$= \frac{j}{\omega c R_{1y}}\left(V_{1y} - \frac{R_{1y}V_{2y}}{R_{2y}}\right)$$

Finally, the current flowing in the cable is calculated in a processor 30 by evaluating $$V_{out} = \sqrt{(V_{out}x)^2 + (V_{out}y)^2}$$

and the measured current displayed on a display device such as an LCD panel (not shown). The connections between the various coils can be effected by using conductive tracks (not shown) laid down on the motherboard 20 using printed circuit board (PCB) technology. The amplifiers AMP1 and AMP2, as well as the processor 30, can be formed by integrated circuit technology and the IC chips located on the motherboard 20 or elsewhere in the device housing.

Figure 8:
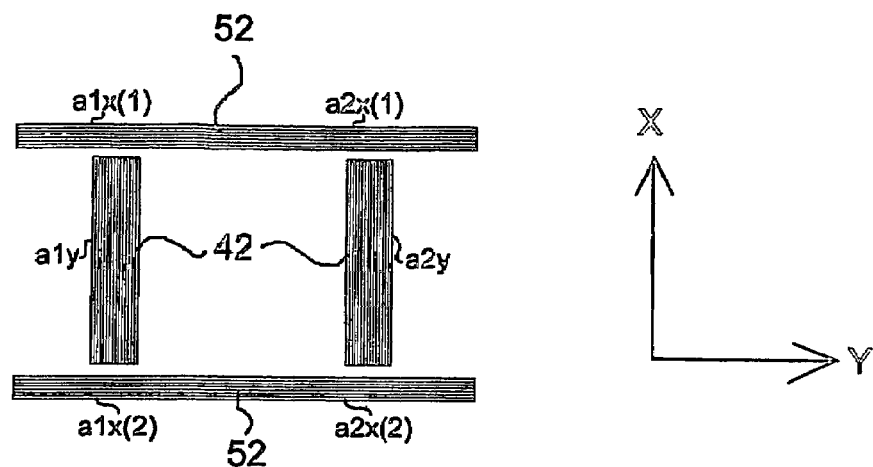
FIG. 8 shows an alternative construction for the orthogonal coils of FIG. 6.
Figure 8:
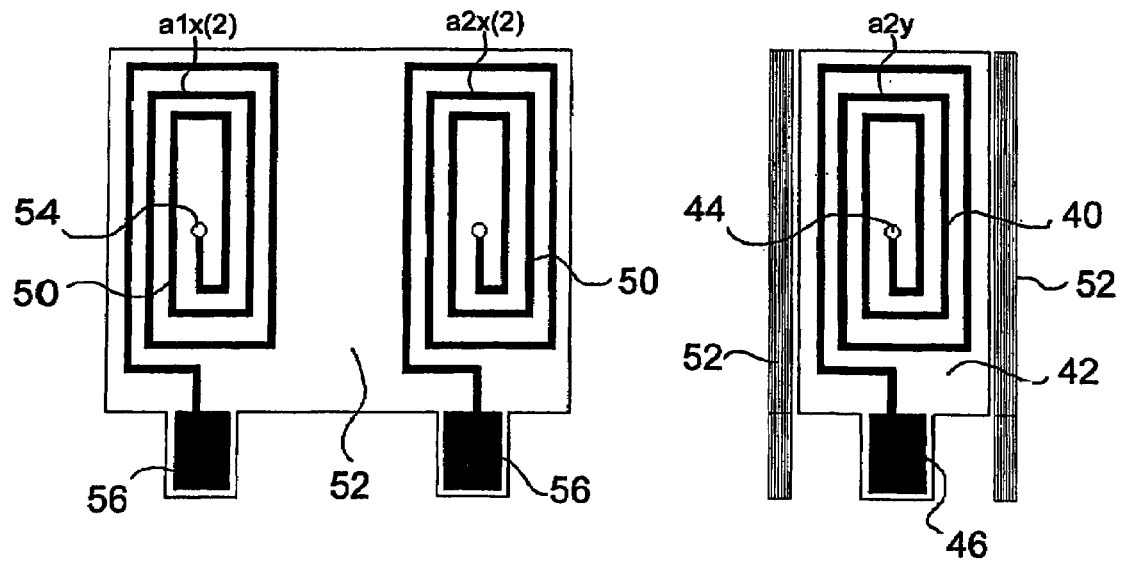

A total of 16 coils are used in this embodiment and ideally the tuns-area product of these coils should be the same to within 1% at least to obtain accurate results. The cost of 16 wirewound coils accurate to this tolerance could be too expensive for many applications. Planar magnetic printed circuit board coils are a lot cheaper and more accurate to manufacture. However, for a true implementation of the apparatus shown in FIGS. 6 and 7, in each pair of orthogonal coils the geometric centre of each of the coils $a1_x$, $b1_x$, etc. picking up the Hx component should be located at the same position as the geometric centre of the corresponding coil $a1_y$, $b1_y$, etc. picking up the Hy component. This is possible using the technique shown in FIG. 9 of U.S. Pat. No. 5,652,506 but not with planar magnetic coils as the tracks are confined to one plane and it is not possible with present day techniques to simultaneously have tracks on orthogonal planes in the same PCB. However, a slight compromise with planar magnetic printed circuit board coils works very well and this arrangement is shown in FIGS. 8(a) to 8(c). FIG. 8 actually shows the PCB implementation of the two orthogonal coil pairs $a1_x/a1_y$ and $a2_x/a2_y$) but the same principle is applicable to the two orthogonal coil pairs on the same radius at each of the other three quadrants of the motherboard 20.

The coils $a1_y$ and $a2_y$ are substantially identical and each is formed as a conductive track 40 on an insulating substrate 42. Although only one side of the substrate is seen in FIG. 8(c), tracks 40 are formed on each opposite surface of the substrate and connected in series through a central via hole 44. Both tracks 40 form the coil whose opposite ends are connected to respective solder pads 46 formed on tabs extending down from the main body of the substrate 42.

By contrast, each coil $a1_x$ and $a2_x$ is formed in two parts. Considering coil $a1_x$, it is formed in two parts $a1_x(1)$ and $a1_x(2)$. The parts $a1_x(1)$ and $a1_x(2)$ are formed as conductive tracks 50 on respective insulating substrates 52. However, each of the parts $a1_x(1)$ and $a1_x(2)$ has a turns-area product half that of the coil $a1_y$. This can be achieved by providing double the number of turns on the coil $a1_y$ than the number on parts $a1_x(1)$ and $a1_x(2)$.

Similarly, the coil $a2_x$ is formed in two parts $a2_x(1)$ and $a2_x(2)$, again formed as conductive tracks 50 on respective insulating substrates 52 and each having a turns-area product half that of the coil $a2_y$. Actually, in this embodiment the parts $a1_x(1)$ and $a2_x(1)$ are formed on one common substrate 52 and likewise the parts $a1_x(2)$ and $a2_x(2)$ are formed on another common substrate 52, but this is not necessary.

The substrates 42, 52 are mounted upstanding vertically in the motherboard 20 by inserting the solder tabs 46, 56 into slots in the motherboard and soldered to tracks on the motherboard. The arrangement is as shown in FIG. 8(a). The coil $a1_y$ is embraced on each side by the coils $a1_x(1)$ and $a1_x(2)$ normal thereto, and the coil $a2_y$ is embraced on each side by the coils $a2_x(1)$ and $d2_x(2)$ normal thereto. The solder tabs 56 are connected by conductive tracks on the motherboard 20 to connect the coils $a1_x(1)$ and $a1_x(2)$ in series in phase to form the coil $a1_x$ and the coils $a2_x(1)$ and $a2_x(2)$ in series in phase to form the coil $a2_x$. Since the coil parts $a1_x(1)$ and $a1_x(2)$ combined have the same turns-area product as the coil $a1_y$ and are equally spaced at either end of coil $a1_y$, as a pair they have the same geometrical centre as coil $a1_y$. Similarly, as a pair the coil parts $a2_x(1)$ and $a2_x(2)$ they have the same geometrical centre as coil $a2_y$. The remaining connections are as shown in FIG. 7.

Modifications of the above embodiment are possible. For example, the turns-area product of the coils $a2_x$ to $d2_x$ could be different to that of the coils $a1_x$ to $d1_x$, provided allowance is made for this in the relative values of the resistors $R_{1x}$ and $R_{2x}$ or elsewhere in the circuit. Similarly, the turns-area product of the coils $a2_y$ to $d2_y$ could be different to that of the coils $a1_y$ to $d1_y$ provided suitable allowance is made elsewhere. Also, if interference from external sources is not probable in the circumstances likely to be encountered in use, the outer sets of coils, i.e. the orthogonal pairs of coils located on the circle of radius $r_2$ in FIG. 6, can be omitted. Further, since diametrically opposite sets of coils are provided primarily to provide a larger signal and to further reduce external interference, as well as reducing errors due to movement of the cable from centre point P, the invention could be implemented with just two sets of coils at 90° spacing, e.g. the sets of coils at the 3 o'clock and 6 o'clock positions of FIG. 6.

The invention is not limited to the embodiments described herein which may be modified or varied without departing from the scope of the invention.

The invention claimed is:

1. An apparatus for measuring alternating current in a conductor, the apparatus comprising first and second coil means having substantially the same turns-area product and substantially parallel axes, the first and second coil means being located on the circumference of a notional circle with the first coil means having its axis tangential to the circle and the second coil means having its axis extending radially of the circle, and third and fourth coil means also having substantially the same turns-area product and substantially parallel axes, the third and fourth coil means being located on the circumference of the notional circle close to the first and second coil means respectively, the third coil means having its axis extending radially of the circle and the fourth coil means having its axis tangential to the circle such that the first and third coil means form a closely adjacent first pair of coil means with substantially orthogonal axes and the second and fourth coil means form a closely adjacent second pair of coil means with substantially orthogonal axes, the first to fourth coil means being mounted on a support means configured to allow a conductor to be introduced into the centre of the said circle with the axis of the conductor normal to the plane containing the first to fourth coil means, the apparatus further comprising means electrically connecting the first and second coil means in series in anti-phase and the third and fourth coil means in series in anti-phase, and means for deriving the alternating current in the conductor as a function of the voltages induced in the series-connected first and second coil means and the series-connected third and fourth coil means.

2. An apparatus as claimed in claim 1, wherein each pair of orthogonal coil means has a substantially identical pair of orthogonal coil means located symmetrically on the diametrically opposite side of the centre of the first notional circle and having the same orientation as its symmetrical counterpart, each coil means and its symmetrical counterpart being connected in series in the same phase.

3. An apparatus as claimed in claim 1, wherein all the coil means have substantially the same turns-area product.

4. An apparatus as claimed in claim 3, wherein the turns-area product of all the coil means are the same to within 1%.

5. An apparatus as claimed in claim 1, wherein each coil means is formed as conductive coil-forming tracks on at least one insulating substrate and the support means comprises an insulating motherboard, the substrates standing upright on the board and the coil-forming tracks on the substrates being connected by conductive tracks on the motherboard.

6. An apparatus as claimed in claim 5, wherein at least one pair of orthogonal coil means comprises a first insulating substrate bearing a first coil-forming track defining one of said pair of orthogonal coil means and second and third insulating substrates disposed substantially normal to the first substrate and bearing second and third coil-forming tracks respectively, the second and third coil-forming tracks being connected together in series and together defining the other of said pair of orthogonal coil means.

7. An apparatus as claimed in claim 6, wherein the second and third coil-forming tracks have a combined turns-area product substantially the same as the first coil-forming track.

8. An apparatus as claimed in claim 6, wherein at least two coil-forming tracks are formed on a common substrate.

9. An apparatus as claimed in claim 1, further comprising fifth and sixth coil means having substantially the same turns-area product and substantially parallel axes, the fifth and sixth coil means being located on the circumference of a second notional circle concentric with, and having a diameter greater than, the first notional circle, the fifth coil means being located radially outwardly of the first coil means and having its axis tangential to the second circle and the sixth coil means being located radially outwardly of the second coil means and having its axis extending radially of the second circle, and seventh and eighth coil means also having substantially the same turns-area product and substantially parallel axes, the seventh and eighth coil means being located on the circumference of the second notional circle close to the fifth and sixth coil means respectively, the seventh coil means having its axis extending radially of the second circle and the eighth coil means having its axis tangential to the second circle such that the fifth and seventh coil means form a closely adjacent third pair of coil means with substantially orthogonal axes and the sixth and eighth coil means form a closely adjacent fourth pair of coil means with substantially orthogonal axes, the apparatus further comprising means electrically connecting the fifth and sixth coil means in series in anti-phase and the seventh and eighth coil means in series in anti-phase, the means for deriving the alternating current in the conductor deriving said current as a function of the voltages induced in the series-connected first and second coil means, the series-connected third and fourth coil means, the series-connected fifth and sixth coil means, and the series-connected seventh and eighth coil means.

10. An apparatus as claimed in claim 9, wherein each pair of orthogonal coil means has a substantially identical pair of orthogonal coil means located symmetrically on the diametrically opposite side of the centre of the first notional circle and having the same orientation as its symmetrical counterpart, each coil means and its symmetrical counterpart being connected in series in the same phase.

11. An apparatus as claimed in claim 9, wherein all the coil means have substantially the same turns-area product.

12. An apparatus as claimed in claim 11, wherein the turns-area product of all the coil means are the same to within 1%.

13. An apparatus as claimed in claim 9, wherein each coil means is formed as conductive coil-forming tracks on at least one insulating substrate and the support means comprises an insulating motherboard, the substrates standing upright on the board and the coil-forming tracks on the substrates being connected by conductive tracks on the motherboard.

14. An apparatus as claimed in claim 13, wherein at least one pair of orthogonal coil means comprises a first insulating substrate bearing a first coil-forming track defining one of said pair of orthogonal coil means and second and third insulating substrates disposed substantially normal to the first substrate and bearing second and third coil-forming tracks respectively, the second and third coil-forming tracks being connected together in series and together defining the other of said pair of orthogonal coil means.

15. An apparatus as claimed in claim 14, wherein the second and third coil-forming tracks have a combined turns-area product substantially the same as the first coil-forming track.

16. An apparatus as claimed in claim 9, wherein at least two coil-forming tracks are formed on a common substrate.

\* \* \* \* \*